United States Patent [19]
Marsden

[11] Patent Number: 5,202,630
[45] Date of Patent: Apr. 13, 1993

[54] THIN FILM SQUID DETECTOR INCLUDING A LOOP RESPONSIVE TO A MAGNETIC FLUX COMPONENT LYING IN THE PLANE OF THE THIN FILM

[75] Inventor: James R. Marsden, San Diego, Calif.

[73] Assignee: Biomagnetic Technologies, Inc., San Diego, Calif.

[21] Appl. No.: 850,984

[22] Filed: Mar. 12, 1992

Related U.S. Application Data

[62] Division of Ser. No. 634,026, Dec. 26, 1990, Pat. No. 5,142,229.

[51] Int. Cl.$^5$ .................... G01R 33/035; H01L 39/22
[52] U.S. Cl. .................................... 324/248; 505/702; 505/846
[58] Field of Search ...................... 324/248; 357/5, 27; 307/306; 505/845, 846, 702, 703

[56] References Cited

U.S. PATENT DOCUMENTS

| | | | |
|---|---|---|---|
| 3,643,237 | 2/1972 | Anacker | 357/5 X |
| 4,837,604 | 6/1989 | Faris | 357/5 |
| 4,869,598 | 9/1989 | McDonald | 307/306 X |

OTHER PUBLICATIONS

M. W. Cromar and P. Carelli, "Low-noise tunnel junction dc SQUID's", Appl. Phys. Lett., vol. 38(9), May 1981, pp. 723-725.

Primary Examiner—Gerard R. Strecker
Attorney, Agent, or Firm—Gregory Garmong

[57] ABSTRACT

A magnetometer is prepared by depositing three thin-film SQUID magnetic field detectors upon a substrate. Two of the detectors incorporate stripline SQUID detectors deposited at right angles to each other, to measure the orthogonal components of a magnetic field that lie in the plane of the substrate. The third detector uses a planar loop SQUID detector that measures the component of the magnetic field that is perpendicular to the substrate. The stripline SQUID detectors have thin-film base and counter electrodes separated by an insulating layer which is at least about 1 micrometer thick, and a pair of Josephson junctions extending between the electrodes through the insulating layer.

9 Claims, 2 Drawing Sheets

THIN FILM SQUID DETECTOR INCLUDING A LOOP RESPONSIVE TO A MAGNETIC FLUX COMPONENT LYING IN THE PLANE OF THE THIN FILM

This is a division of application Ser. No. 07/634,026, filed Dec. 26, 1990 now U.S. Pat. No. 5,142,229

BACKGROUND OF THE INVENTION

This invention relates to devices for measuring magnetic fields, and, more particularly, to a sensitive thin-film magnetometer that is planar yet can measure the three orthogonal components of a very small magnetic field.

A magnetometer is a device that measures the presence and magnitude of a magnetic field, and, in the case of a vector magnetometer, the direction of the magnetic field. In a conventional magnetometer, an input loop (or coil) of an electrical conductor is placed into a varying magnetic field. The magnetic flux passing through the loop creates a responsive movement of electrical charge. The resulting electrical current is measured, and the magnetic field is calculated from the measured electrical current.

It is usually important to understand both the direction and the magnitude of the magnetic field. A magnetic field can be visualized as a vector having orthogonal components along three axes. To characterize the magnetic field completely, the magnetometer may have either three separate loops oriented perpendicular to the axes of interest, or a single loop whose orientation can be changed until it is perpendicular to the magnetic field. In the case of the three-axis magnetometer the components of the magnetic field are individually measured and the total magnetic field can be calculated, and in the case of the single movable loop the total field is measured and the components can be calculated.

In some areas of technology it is desirable, but difficult, to measure the local character of a magnetic field with accuracy and very high spatial resolution. For example, where the magnetic field is emitted from a solid body it is desirable to measure the magnetic field at various locations adjacent the solid body in order to understand its origin. Such circumstances arise in biomagnetometry, the study of magnetic field arising from the human body, and in nondestructive testing, the study of the integrity of a body from external measurements that do not adversely influence the body.

To achieve a particular spatial resolution in such circumstances, the magnetometer loop or loops must be made with a lateral dimension on the same order of size as the desired spatial resolution. To achieve good accuracy, the magnetometer loop must be placed as closely as possible to the body whose magnetic field is to be measured. One inherent limiting factor in such measurements is that, as the loop is made smaller so that it can achieve good spatial resolution and be placed close to the surface, the current detector must be made more sensitive because the loop receives a lower magnetic flux per unit time than does a larger loop. Also, as the loop or loops are made smaller, it becomes progressively more difficult to controllably and reproducibly orient the loop or loops adjacent the body to be measured. The components of the magnetic field parallel to the surface of the body are particularly difficult to measure, because the loops must be oriented with their normal vectors parallel to the surface.

There is a continuing need for a magnetometer that achieves both high sensitivity and high spatial resolution for magnetic fields originating in a body. Such a magnetometer must be able to measure all three components of the magnetic field vector. The present invention fulfills this need, and further provides related advantages.

SUMMARY OF THE INVENTION

The present invention provides a three-axis magnetometer that is planar, and is conveniently deposited upon a substrate as a thin-film device. The magnetometer can be placed within a few thousandths of an inch of the surface of the body whose magnetic field is to be measured. The lateral dimension of the magnetometer relative to each of the three components of the magnetic field is on the order of a few thousandths of an inch or less. The magnetic field detector is one of the most sensitive detectors known. As a result of these factors, the magnetometer is highly effective in measuring the three components of a small magnetic field or small variations in a magnetic field emanating from a body, with extremely high spatial resolution.

In accordance with the invention, a three-axis planar magnetometer comprises a substrate; and a first thin film magnetic field detector deposited upon the substrate, the first magnetic field detector measuring a first component of a magnetic field that lies in the plane of the substrate; a second thin film magnetic field detector deposited upon the substrate, the second magnetic field detector measuring a second component of the magnetic field that lies in the plane of the substrate and is non-colinear with the first component of the magnetic field; and a third thin film magnetic field detector deposited upon the substrate, the third magnetic field detector measuring a third component of the magnetic field that is perpendicular to the plane of the substrate. More generally, a three-axis planar magnetometer comprises a substrate; and means for detecting three non-coplanar components of a magnetic field, the means for detecting being a thin film that is substantially coplanar with and supported upon the substrate.

In one preferred approach to the present invention, the magnetometer utilizes Superconducting QUantum Interference Devices, known in the art by the acronym "SQUID", as detectors. When cooled to the superconducting temperature range of their components, SQUIDs are highly sensitive detectors of electrical current flows, and thereby magnetic fields. Techniques are known for fabricating SQUIDs as thin-film, planar devices on a substrate by microelectronic fabrication procedures, producing SQUIDs that are only a few thousandths of an inch in transverse dimension.

The three components of a magnetic field are measured by employing two different types of SQUID detectors. A planar loop SQUID detector is sensitive to a component of a magnetic field perpendicular to the plane of the loop, and such a SQUID detector can therefore be used to measure the component of the magnetic field perpendicular to the plane of the substrate upon which the loop is deposited.

A stripline SQUID detector is sensitive to a component of a magnetic field having a particular orientation within the plane of the SQUID detector, and such a SQUID detector can therefore be used to measure one of the components of the magnetic field lying within the plane of the substrate upon which the stripline SQUID detector is deposited. A second stripline SQUID detector oriented at an angle (preferably 90 degrees) to the first stripline SQUID detector is used to measure the other of the components of the magnetic field lying within the plane of the substrate upon which the stripline SQUID detector is deposited.

In accordance with this aspect of the invention, a stripline thin-film SQUID detector operable at a preselected temperature to measure magnetic fields lying in the plane of the thin film comprises a thin-film base electrode made of a material that is superconducting at the preselected temperature; a thin-film counter electrode overlying the base electrode and spaced at least about 1 micrometer therefrom, the counter electrode being made of a material that is superconducting at the preselected temperature; an insulating layer between the base electrode and the counter electrode; and two Josephson junctions extending between the base electrode and the counter electrode, through the insulating layer.

The magnetometer of the invention not only measures the three components of a magnetic field, but does so with high spatial resolution and sensitivity. It can be used in situations where the magnetometer must be placed close to the body that produces the magnetic field, in order to achieve the high resolution. The magnetometer can be fabricated using known microelectronic deposition, patterning, and material removal techniques, as a planar device on the surface of a substrate. Other features and advantages of the invention will be apparent from the following more detailed description of the preferred embodiments, taken in conjunction with the accompanying drawings, which illustrate, by way of example, the principles of the invention.

DETAILED DESCRIPTION OF THE PREFERRED EMBODIMENTS

In accordance with a preferred embodiment of the invention, a three-axis planar magnetometer comprises a substrate; and a first stripline SQUID detector deposited upon the substrate; a second stripline SQUID detector deposited upon the substrate and oriented at an angle to the first stripline SQUID detector; and a planar loop SQUID detector deposited upon the substrate.

Figure 1:
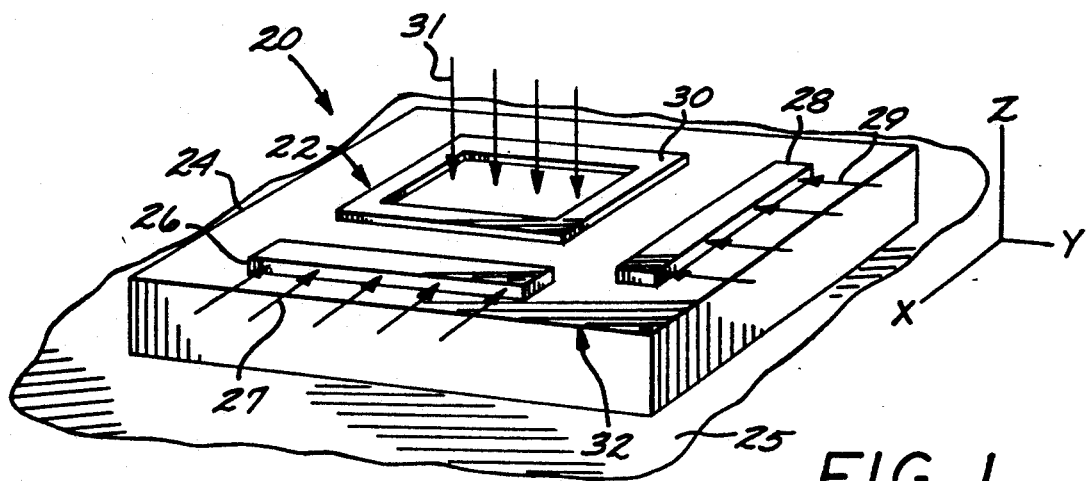
FIG. 1 is a perspective view of a preferred embodiment of a three-axis magnetometer according to the invention.

FIG. 1 illustrates a three-axis magnetometer 20 with detector means 22 supported upon a planar substrate 24. (Also shown in FIG. 1 is a set of superimposed orthogonal x-y-z axes, which are provided to aid in the discussion of the embodiment but are not themselves a part of the invention. In the figure, the x and y axes lie in the plane of the substrate 24 at right angles to each other and the z axis is perpendicular to the plane of the substrate 24.) The detector means 22 preferably includes a SQUID detector that is operated at a temperature below its superconducting transition temperature $T_c$. The substrate 24 is therefore preferably cooled during operation to a temperature below the superconducting transition temperature of the material used to construct the detector means 22. The substrate 24 is preferably a conventional electronic microcircuit substrate such as a piece of silicon or sapphire (aluminum oxide) having a thickness of from about 0.008 to about 0.020 inches. Sapphire is most preferred as the substrate material, because of its good thermal conductivity.

The substrate 24 is typically mounted on the outer surface of a vessel (not shown) that contains a cryogenic fluid such as liquid helium (boiling point 4.2K) for a conventional low $T_c$ superconductor, or liquid nitrogen (boiling point 77K) for a high $T_c$ superconductor, as may be appropriate for the selected materials of construction of the detector means 22. The detector means 22 is cooled to below its $T_c$ by conduction through the substrate 24.

The detector means 22 includes three Superconducting QUantum Interference Device ("SQUID") detectors, two of which are stripline SQUID detectors and the third a planar loop SQUID detector. (In FIG. 1, the SQUID detectors are indicated in a schematic form, and their operation will be discussed in more detail subsequently.) A first stripline SQUID detector 26 is deposited upon the substrate 24 and oriented parallel to the y-axis. The first stripline SQUID detector 26 is sensitive to magnetic field vector components 27 parallel to the x-axis. A second stripline SQUID detector 28 is deposited upon the substrate 24 and oriented parallel to the x-axis. The second stripline SQUID detector 28 is sensitive to magnetic field vector components 29 parallel to the y-axis. A planar loop SQUID 30 is deposited upon the substrate 24 with its loop extending in the x and y directions. The planar loop SQUID 30 is sensitive to magnetic field vector components 31 parallel to the z-axis. Because one SQUID detector measures each magnetic field component, the three detectors are used together and form a basic trio unit 32.

Figure 2:
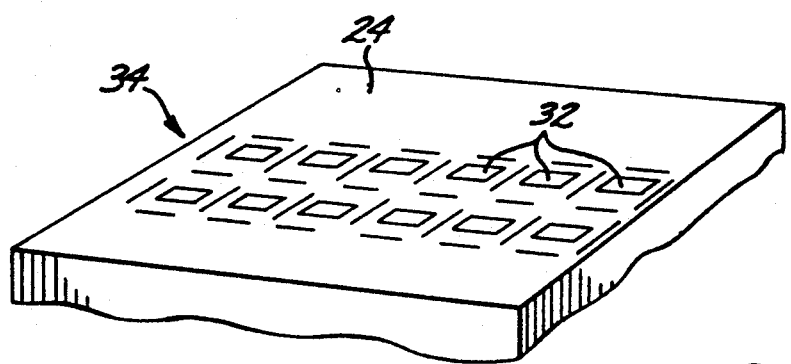
FIG. 2 is a perspective view of another embodiment of the three-axis magnetometer employing multiple sets of detectors.

FIG. 2 illustrates another three-axis magnetometer 34, having at least two of the trio units 32 (of SQUID detectors 26, 28, and 30), and preferably a plurality of the trio units 32. (Since the stripline SQUID detectors 26 and 28 are essentially linear units, they are depicted schematically in FIG. 2 as straight lines for ease of illustration. Since the planar loop SQUID detectors 30 are essentially planar square loops in one form, they are depicted schematically as squares.) These trio units 32 are arranged in an ordered array across the face of the substrate 24.

This arrayed form of the SQUID detectors permits the spatial variation of a magnetic field to be determined without moving the three-axis magnetometer relative to the body bring measured. The SQUID detectors are deposited and supported on the surface of the substrate, and can therefore be placed very close to another object that is emitting the magnetic field of interest. The SQUID detectors can be fabricated with dimensions and spacings on the order of one to a few thousandths of an inch. The combination of sensitivity of the SQUID detectors, small dimensions of the SQUID detectors, small spacings of the SQUID detectors, and proximity of the substrate surface to the object being measured all contribute to high resolution, high sensitivity measurements of all three components of the magnetic field.

Figure 3:
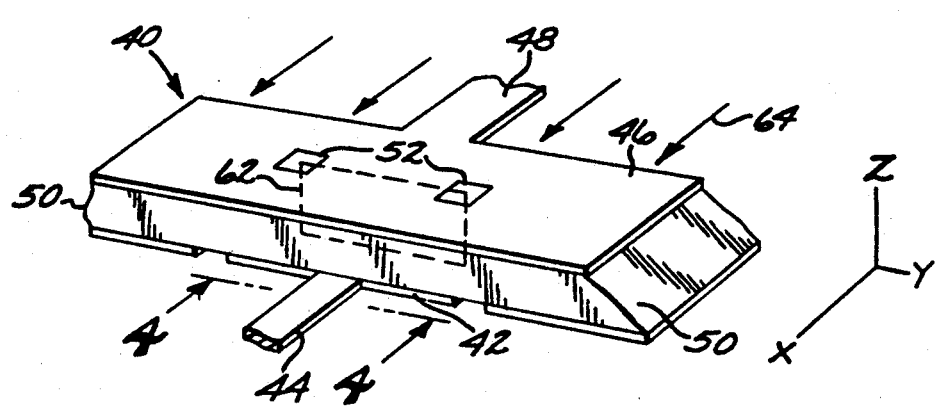
FIG. 3 is a perspective view of a stripline SQUID detector used in the magnetometer of FIG. 1.
Figure 4:
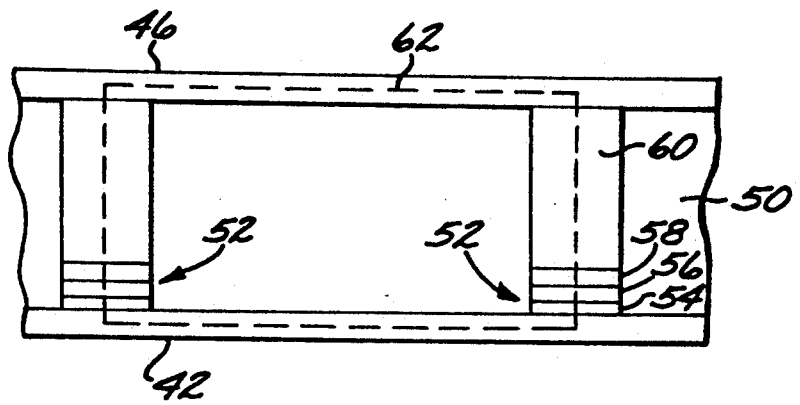
FIG. 4 is an enlarged side elevational view of the stripline SQUID detector of FIG. 3, in a view taken along line 4—4.

The structure of a stripline SQUID detector 40 suitable for the present application is illustrated in perspective view in FIG. 3, and in detailed elevational view in FIG. 4. This configuration of stripline SQUID detector is preferably used for the first stripline SQUID detector 26 and the second stripline SQUID detector 28.

The stripline SQUID detector 40 includes a base electrode 42 with an integral attachment lead 44, and a parallel, spaced-apart counter electrode 46 with an integral attachment lead 48. The electrodes 42 and 46, and their leads 44 and 48, are formed by microelectronic techniques such as deposition and patterning. The electrodes 42 and 46 are formed from a material that is superconducting at a selected temperature of operation. In the preferred embodiment, the electrodes 42 and 46 are formed of niobium metal.

Separating the electrodes 42 and 46 is a layer 50 of an insulating material. The preferred insulating material is a polymer such as a polyimide dissolved in a solvent, available commercially from duPont Corp. as PI-2555, applied as a spin-on insulation. The important advantage of using a polymer insulation layer 50 is that it can be made quite thick. Many conventional microelectronic insulating materials, such as silicon monoxide, cannot be practically applied in thicknesses as great as one micrometer or more.

Extending between the electrodes 42 and 46 are two Josephson junctions 52, illustrated in general view in FIG. 3 and in more detail in FIG. 4. Each Josephson junction 52 includes a first metallic layer 54, which is preferably aluminum about 60–80 Angstroms thick, an insulating layer 56, which is preferably aluminum oxide about 20 Angstroms thick, and a second metallic layer 58, which is preferably aluminum about 20 Angstroms thick. The performance of the SQUID depends upon the thickness of the insulating layer 56, so that the thickness may be varied but is typically about 20 Angstroms. A superconducting layer 60 of the same material as the electrodes 42 and 46 is deposited over the second metallic layer 58 to adjust the height of the Josephson junction to match the thickness of the insulation layer 50.

The electrodes 42 and 46 and the Josephson junctions 52 define an input coil 62, indicated in the figures by a dashed line in the form of a rectangle. The plane of the rectangle is perpendicular to the plane of the electrodes 42 and 46, and also perpendicular to the x-axis, which is perpendicular to the line joining the Josephson junctions 52. Magnetic flux lines, indicated schematically by vectors 64 parallel to the x-axis, induce a current flow through the input coil 62. This current flow is detected by the Josephson junctions 52, permitting detection of the magnetic flux component lying in the plane of the electrodes 42 and 46. The distance between the electrodes 42 and 46 is about 4 micrometers in the preferred embodiment, which is about 1/6 of one-thousandth of an inch. Thus, the stripline SQUID detector 40 is a substantially planar device, which can be placed quite close to the surface of a magnetic field source and still make measurements of the magnetic field component that lies parallel to that surface.

Thus, the stripline SQUID is essentially a linear, single dimension device, as shown in FIGS. 1–3. Its length is typically about 200 micrometers (or about 0.008 inches), its width is typically about 50 micrometers, and its height between the base electrode and the counter electrode is typically about 4 micrometers in the form used in the magnetometer of the invention.

The stripline SQUID must have a spacing between the electrodes 42 and 46 (i.e., thickness of the insulating layer 50) of at least about 1 micrometer. Two considerations are important in determining the minimum spacing between the electrodes. The first is that the maximum capacitance between the electrodes 42 and 46 must be less than the capacitance of the Josephson junctions 52. For a typical junction capacitance of $10^{12}$ Farad, an electrode length of 100 micrometers, an electrode width of 20 micrometers, and an insulator dielectric constant of 3 $\epsilon_0$, the absolute minimum thickness is about 0.05 micrometers. However, this thickness is impractical to make and allows insufficient flux coupling into the device. For a useful device, the lower limit of spacing between the electrodes 42 and 46 is set by the maximum desired equivalent field noise. To reduce the noise below $1$ $pT/(Hz)^{\frac{1}{2}}$, a minimum spacing of about 1 micrometer is required. If the spacing is less, then the sensitivity of the SQUID to magnetic fields lying in the plane of the electrodes is simply too small to be useful. There is no upper limit on the spacing between the electrodes, as increasing the spacing increases the sensitivity of the SQUID. As the spacing becomes larger, however, the device is less planar in character. A typical practical upper limit of the thickness is about 20 micrometers, or just under 1 mil. In this thickness, the device remains substantially planar, yet is able to detect magnetic fields parallel to the plane of the device.

Linear SQUID structures are known in the art, see, for example, M. W. Cromar and P. Carelli, "Low-noise tunnel junction dc SQUID's" *Appl. Phys. Lett.*, Vol. 38, No. 9, pages 723–725 (1981). However, conventional linear SQUID structures have been designed to have as low an inductance as possible, and have not been used as magnetic field detectors. The spacing between the electrodes of the linear SQUID of Cromar and Carelli is 350 nanometers (i.e., 0.35 micrometer), as determined by their silicon monoxide insulator technology. As discussed above, this spacing is simply too small to permit the direct detection of in-plane magnetic fields due to the small resulting loop area. Only by making the spacing between the electrodes more than about 1 micrometer, as in the present device, can the practical stripline SQUID suitable for direct magnetic field measurements be built.

Figure 5:
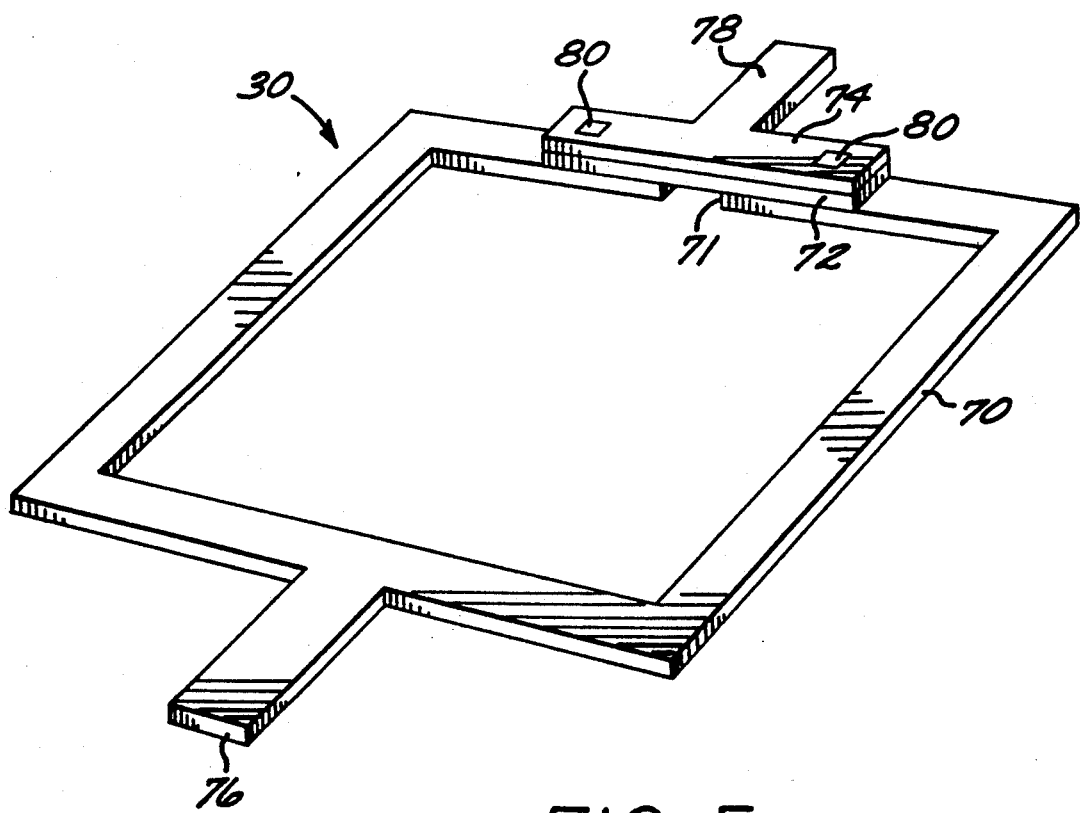
FIG. 5 is a perspective view of a planar loop SQUID detector used in the magnetometer of FIG. 1.

FIG. 5 illustrates a planar loop SQUID detector preferred for use as the detector 30. Such SQUIDs are known in the art and are described, for example, in U.S. Pat. Nos. 4,761,611, 4,386,361, and 4,389,612, whose disclosures are incorporated by reference. Briefly, such a SQUID includes a patterned planar loop 70 formed of a material such as niobium that becomes superconducting when cooled below its superconducting transition temperature $T_c$. The loop 70 is interrupted at some location 71, and an insulating layer 72 (of a material such as silicon dioxide) and overlying superconducting layer 74 (of a material such as niobium) bridge between the two sides of the loop. One SQUID contact 76 is to the loop 70, and the other SQUID contact 78 is to the superconducting layer 74. Josephson junctions 80 are provided between the superconducting layer 74 and the loop 70, one on each side of the location 71. The Josephson junctions are generally as described previously, except that they need not be made with a large separation between the layer 74 and the loop 70. Each Josephson junction 80 is preferably formed as a layer of aluminum about 30 Angstroms thick, a layer of aluminum oxide about 20 Angstroms thick, and another layer of aluminum about 30 Angstroms thick. The entire planar loop SQUID detector 30 is readily formed by deposition, patterning, and etching of layers by conventional microelectronic techniques well known in the art. The total thickness of the planar loop SQUID detector is typically about 5000 nanometers, and the lateral dimensions of the loop 70 are about 50 micrometers by about 50 micrometers. A magnetic field component passing through the loop 70 excites a current flow in the loop, whose presence is detected by the Josephson junctions 70.

SQUID detector electronics for both the stripline and planar loop SQUIDs is well known in the art. See, for example, U.S. Pat. Nos. 4,386,361 and 4,389,612.

Thus, the present invention provides an important advance in the art of magnetic field detectors. The magnetometer of the invention can be deposited on a substrate to form a very thin detecting device that can be placed close to the object whose magnetic field emissions are to be measured. The detectors measure the three orthogonal components of the magnetic field, with a spatial resolution that is on the order of 100 micrometers or less in the preferred approach, but which may become even smaller with improvements in SQUID detector design and fabrication techniques.

Although particular embodiments of the invention have been described in detail for purposes of illustration, various modifications may be made without departing from the spirit and scope of the invention. Accordingly, the invention is not to be limited except as by the appended claims.

What is claimed is:

1. A thin-film SQUID detector operable at a preselected temperature to measure a component of a magnetic flux lying in the plane of the thin film, comprising:
   a thin-film base electrode made of a material that is superconducting at the preselected temperature;
   a thin-film counter electrode overlying the base electrode and spaced at least about 1 micrometer therefrom, the counter electrode being made of a material that is superconducting at the preselected temperature;
   an insulating layer between the base electrode and the counter electrode; and
   two laterally spaced-apart Josephson junctions extending substantially perpendicularly between the base electrode and the counter electrode through respective openings in the insulating layer, the two Josephson junctions electrically interconnecting the base electrode and the counter electrode at the spaced-apart locations to form a loop in which an electrical current flows responsive to the penetration of the loop by a component of a magnetic flux lying in the plane of the thin film.

2. The SQUID detector of claim 1, wherein the spacing between the base electrode and the counter electrode is about 4 micrometers.

3. The SQUID detector of claim 1, wherein the insulating layer is a cured polymer material.

4. The SQUID detector of claim 1, wherein the base electrode and the counter electrode are made of niobium.

5. The SQUID detector of claim 1, wherein at least one of the Josephson junctions comprises:
   a layer of an insulator intermediate the base electrode and the counter electrode.

6. The SQUID detector of claim 5, wherein the insulator is aluminum oxide.

7. The SQUID detector of claim 5, wherein the layer of an insulator is about 20 Angstroms thick.

8. The SQUID detector of claim 1, wherein at least one of the Josephson junctions comprises:
   a first layer of aluminum,
   a layer of aluminum oxide overlying the first layer of aluminum, and
   a second layer of aluminum overlying the layer of aluminum oxide.

9. The SQUID detector of claim 1, wherein the spacing of the base electrode from the counter electrode is from about 1 to about 20 micrometers.

* * * * *